(12) United States Patent
Jindal et al.

(10) Patent No.: US 8,872,252 B2
(45) Date of Patent: Oct. 28, 2014

(54) MULTI-TIERED SEMICONDUCTOR APPARATUSES INCLUDING RESIDUAL SILICIDE IN SEMICONDUCTOR TIER

(75) Inventors: Anurag Jindal, Boise, ID (US); Gowri Damarla, Boise, ID (US); Roger W. Lindsay, Boise, ID (US); Eric Blomiley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 13/197,557

(22) Filed: Aug. 3, 2011

(65) Prior Publication Data

US 2013/0032870 A1 Feb. 7, 2013

(51) Int. Cl.
*H01L 29/788* (2006.01)
*H01L 27/115* (2006.01)
*H01L 21/3213* (2006.01)
*H01L 21/02* (2006.01)

(52) U.S. Cl.
CPC .... *H01L 27/11556* (2013.01); *H01L 21/32134* (2013.01); *H01L 21/02057* (2013.01)
USPC .............. 257/321; 257/E21.422; 257/E21.68; 257/315; 438/264; 438/588

(58) Field of Classification Search
USPC .................... 257/315, 321, E21.422, E21.68; 438/264, 588
See application file for complete search history.

(56) References Cited

U.S. PATENT DOCUMENTS

| | | | |
|---|---|---|---|
| 5,326,724 A * | 7/1994 | Wei | 438/655 |
| 2002/0042197 A1* | 4/2002 | Cabral et al. | 438/655 |
| 2007/0252201 A1* | 11/2007 | Kito et al. | 257/331 |
| 2008/0017918 A1 | 1/2008 | Kim | |
| 2009/0190398 A1* | 7/2009 | Kang et al. | 365/185.03 |
| 2010/0001282 A1 | 1/2010 | Mieno | |
| 2010/0155810 A1* | 6/2010 | Kim et al. | 257/316 |
| 2010/0187660 A1 | 7/2010 | Tang et al. | |
| 2010/0240205 A1* | 9/2010 | Son et al. | 438/588 |
| 2012/0001252 A1* | 1/2012 | Alsmeier et al. | 257/321 |

* cited by examiner

*Primary Examiner* — Fernando L Toledo
*Assistant Examiner* — Peter Bradford
(74) *Attorney, Agent, or Firm* — Schwegman Lundberg & Woessner, P.A.

(57) ABSTRACT

Methods of forming multi-tiered semiconductor devices are described, along with apparatuses that include them. In one such method, a silicide is formed in a tier of silicon, the silicide is removed, and a device is formed at least partially in a void that was occupied by the silicide. One such apparatus includes a tier of silicon with a void between tiers of dielectric material. Residual silicide is on the tier of silicon and/or on the tiers of dielectric material and a device is formed at least partially in the void. Additional embodiments are also described.

13 Claims, 7 Drawing Sheets

MULTI-TIERED SEMICONDUCTOR APPARATUSES INCLUDING RESIDUAL SILICIDE IN SEMICONDUCTOR TIER

BACKGROUND

Non-volatile semiconductor memories (NVSMs) are widely used in many electronic devices such as personal digital assistants (PDAs), laptop computers, mobile phones and digital cameras. Some of these memories have arrays of charge storage transistors, such as floating gate transistors.

BRIEF DESCRIPTION OF THE DRAWINGS

Some embodiments are illustrated by way of example and not limitation in the figures of the accompanying drawings in which.

DETAILED DESCRIPTION

For the purposes of this document, a "tier of semiconductor material" can mean semiconductor material formed in the same plane, rank, row, or unit, such as in a horizontal, vertical, or sloped plane, row, rank, or unit of a structure.

Figure 1:
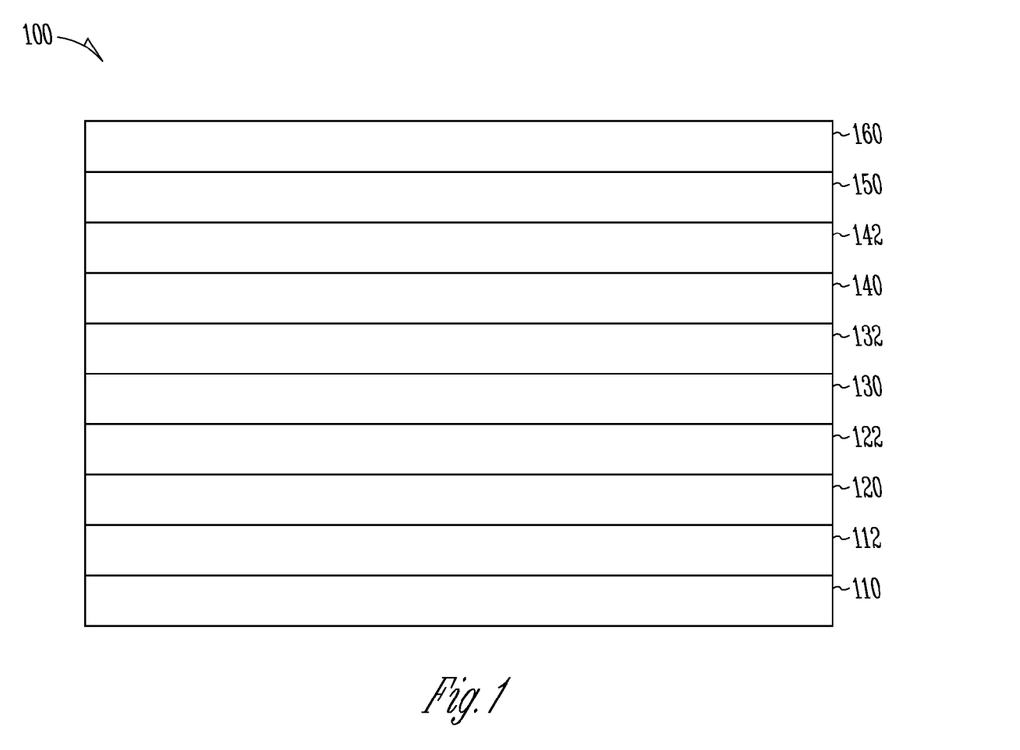
FIG. 1 is a cross-sectional side view of an apparatus in the form of a semiconductor construction according to various embodiments of the invention.

FIG. 1 is a cross-sectional side view of an apparatus in the form of a semiconductor construction 100 according to various embodiments of the invention. Elements in the semiconductor construction 100 will be identified by the same reference numerals throughout the drawings for purposes of brevity and clarity. In addition, acts may be described herein related to the formation of a single device, but the acts may result in the formation of more than one device. Thus, it is understood that the acts described herein may be applied to multiple devices, such as an array of devices, as well.

The semiconductor construction 100 includes a first tier of a dielectric 110. The first tier of the dielectric 110 can be formed in a p type well as part of a substrate (not shown), and the substrate may comprise silicon. Alternate tiers of polysilicon and a dielectric can be formed on the first tier of the dielectric 110. For example, a first tier of polysilicon 112 may be formed on the first tier of dielectric 110. A second tier of the dielectric 120 may then be formed on the first tier of polysilicon 112. A second tier of the polysilicon 122 may then be formed on the second tier of the dielectric 120. A third tier of the dielectric 130 may then be formed on the second tier of the polysilicon 122. A third tier of the polysilicon 132 may then be formed on the third tier of the dielectric 130. A fourth tier of the dielectric 140 may then be formed on the third tier of the polysilicon 132. A fourth tier of the polysilicon 142 may then be formed on the fourth tier of the dielectric 140. A fifth tier of the dielectric 150 may then be formed on the fourth tier of the polysilicon 142. A silicon nitride ($Si_3N_4$) mask 160 may then be formed on the fifth tier of the dielectric 150. The silicon nitride mask 160 can be subjected to planarization such as chemical-mechanical planarization (CMP). The alternate formation of the tiers of dielectrics and the tiers of polysilicon may be reversed. More or fewer tiers of dielectrics and polysilicon may be formed according to various embodiments of the invention. The tiers of dielectrics 110, 120, 130, 140 and 150 may comprise, for example, silicon dioxide ($SiO_2$). Tiers of undoped silicon or n type silicon or p type silicon, for example, may be substituted for the tiers of polysilicon 112, 122, 132 and 142. The tiers of polysilicon 112, 122, 132 and 142 may comprise n type polysilicon or p type polysilicon. The different tiers of semiconductor material and the different tiers of dielectric material, however, may not necessarily comprise the same semiconductor material or the same dielectric material, respectively.

Figure 2:
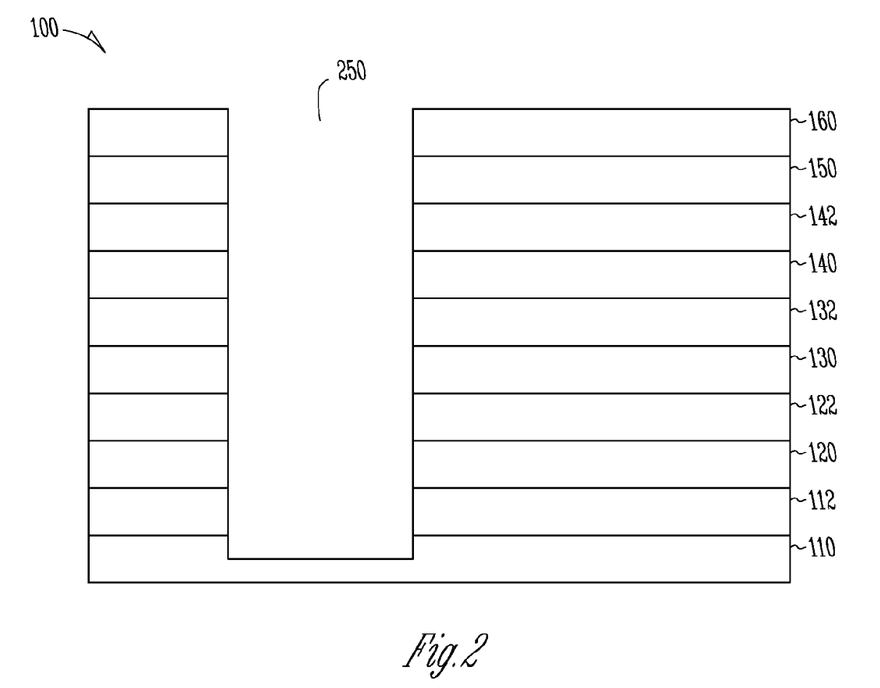
FIG. 2 is a cross-sectional side view of a semiconductor construction according to various embodiments of the invention.

FIG. 2 is a cross-sectional side view of the semiconductor construction 100 according to various embodiments of the invention. A vertical channel 250 can be etched through the silicon nitride mask 160, the tiers of dielectrics 120, 130, 140 and 150 and the tiers of polysilicon 112, 122, 132 and 142. The etch of the vertical channel 250 ends into the first tier of the dielectric 110. The vertical channel 250 can be etched by, for example, a single dry etch chemistry, such as reactive ion etching. The vertical channel 250 may have a diameter of about 50 to about 250 nanometers and a height of about 2 micrometers.

The semiconductor construction 100 can be cleaned with, for example, a wet clean procedure to remove silicon dioxide. For example, a 100:1 solution of hydrofluoric acid is applied to remove approximately 15 to 50 angstroms of silicon dioxide from the semiconductor construction 100.

Figure 3:
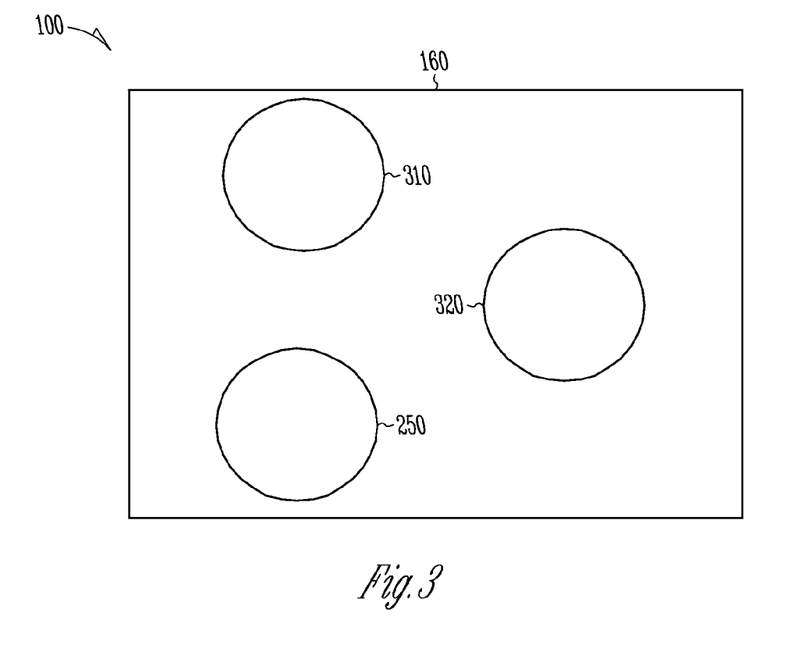
FIG. 3 is a top view of a semiconductor construction according to various embodiments of the invention.

FIG. 3 is a top view of the semiconductor construction 100 according to various embodiments of the invention. The vertical channel 250 is shown etched in the semiconductor construction 100 along with additional vertical channels 310 and 320 to illustrate that more than one vertical channel may be etched in the semiconductor construction 100.

Figure 4:
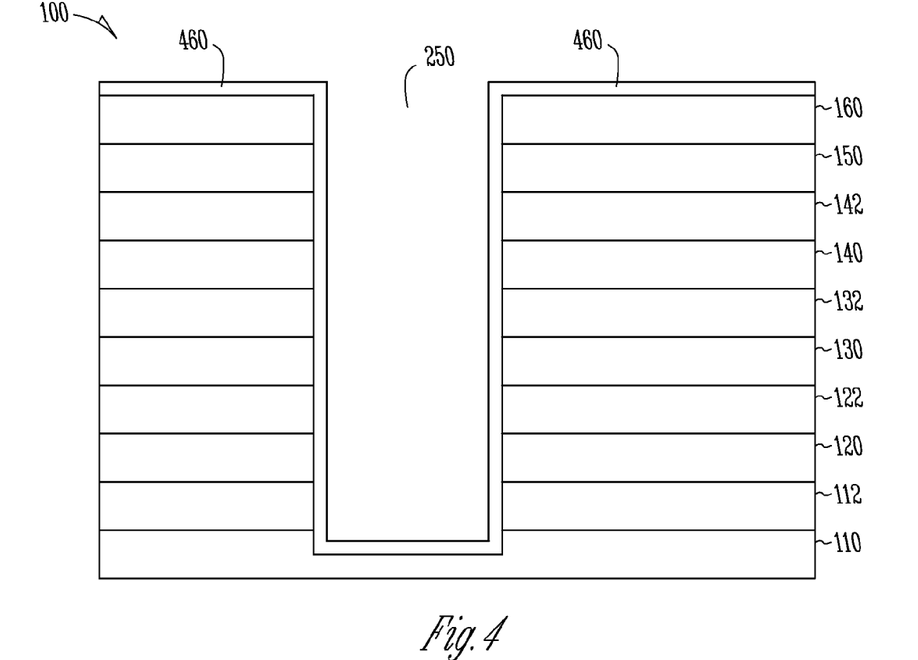
FIG. 4 is a cross-sectional side view of a semiconductor construction according to various embodiments of the invention.

FIG. 4 is a cross-sectional side view of the semiconductor construction 100 according to various embodiments of the invention. A metal film 460 can be formed (e.g., deposited) over the semiconductor construction 100 including over the silicon nitride mask 160 and inside the vertical channel 250. The metal film 460 can be deposited over the tiers of dielectrics 110, 120, 130, 140 and 150 and the tiers of polysilicon 112, 122, 132 and 142 that were cleaned by the wet clean procedure described with respect to FIG. 2. The metal film 460 can have a thickness of between about 25 angstroms and about 200 angstroms and may be deposited by, for example, chemical vapor deposition (CVD), atomic layer deposition (ALD), physical vapor deposition (PVD) or evaporation. The metal film 460 comprises cobalt (Co), and may alternatively comprise, for example, titanium (Ti), tungsten (W), nickel (Ni), tantalum (Ta), platinum (Pt) or molybdenum (Mo) according to various embodiments of the invention.

Figure 5:
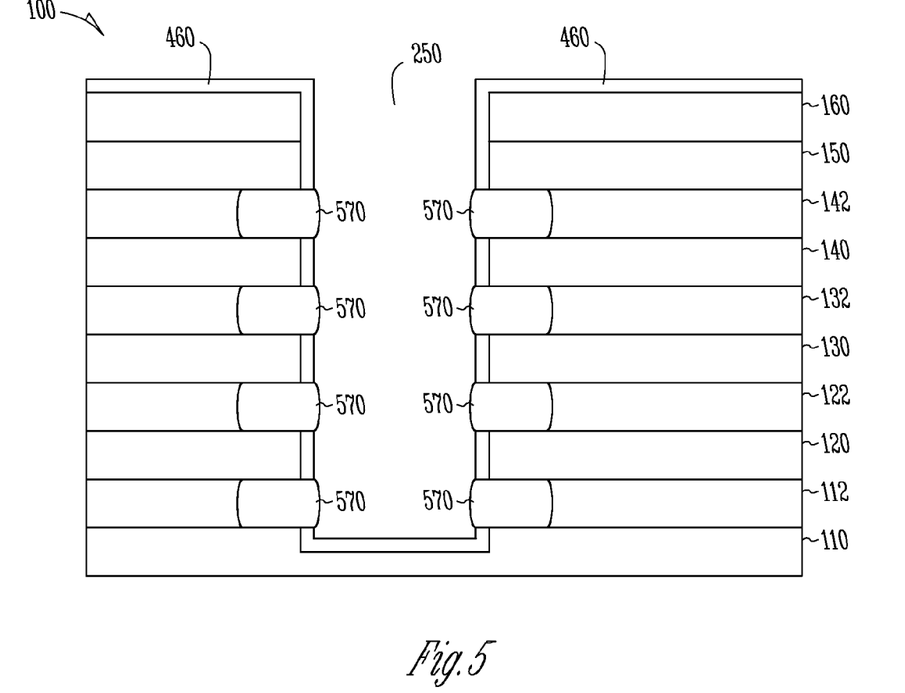
FIG. 5 is a cross-sectional side view of a semiconductor construction according to various embodiments of the invention.

FIG. 5 is a cross-sectional side view of the semiconductor construction 100 according to various embodiments of the invention. The semiconductor construction 100 can be subjected to an annealing operation such as, for example, a Rapid Thermal Processing (RTP) anneal to cause the metal film 460 inside the vertical channel 250 to react with the tiers of polysilicon 112, 122, 132 and 142 to form portions of silicide 570. If the metal film 460 comprises cobalt, the semiconductor construction 100 may be heated to a temperature of between about 400 and about 600 degrees Celsius for about 30 to about 120 seconds in a nitrogen ($N_2$) atmosphere during the RTP anneal to react the cobalt with the tiers of polysilicon 112, 122, 132 and 142. The temperature of the RTP anneal can be different for a different metal composition. The RTP anneal consumes a portion of the tiers of polysilicon 112, 122, 132 and 142, such that the portions of silicide 570 extend into the tiers of polysilicon 112, 122, 132 and 142, between the tiers of dielectrics 110, 120, 130, 140 and 150. The portions of silicide 570 also extend into the vertical channel 250. The portions of silicide 570 comprise cobalt silicide (CoSi). The portions of silicide 570 may alternatively comprise, for example, titanium silicide (TiSi), tungsten silicide (WSi), nickel silicide (NiSi), tantalum silicide (TaSi), molybdenum silicide (MoSi) or platinum silicide (PtSi), depending on the composition of the metal film 460, according to various embodiments of the invention.

Figure 6:
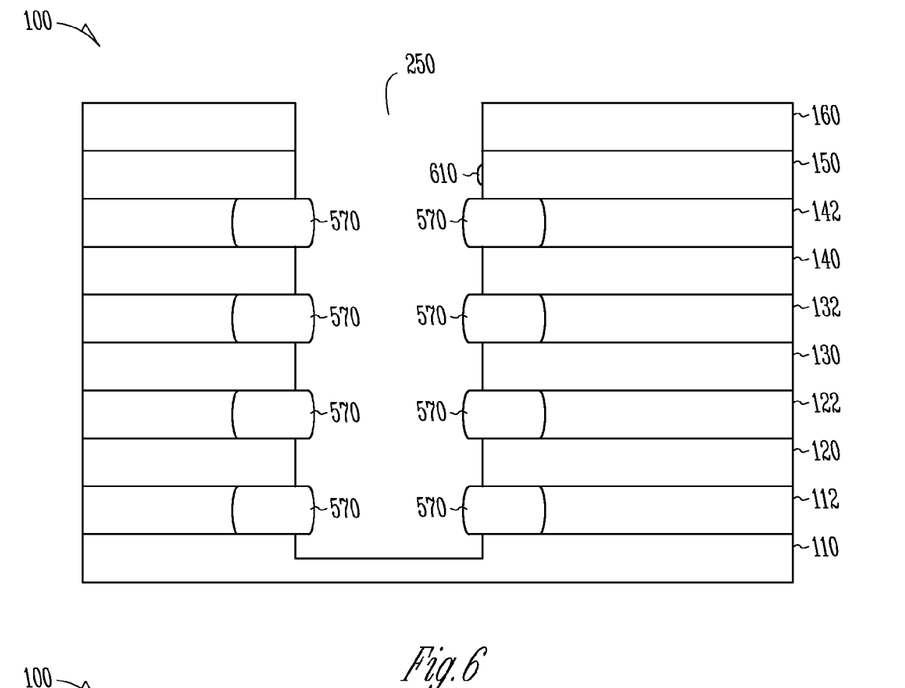
FIG. 6 is a cross-sectional side view of a semiconductor construction according to various embodiments of the invention.

FIG. 6 is a cross-sectional side view of the semiconductor construction 100 according to various embodiments of the invention. The semiconductor construction 100 can be subjected to a wet etch process, such as to at least substantially remove the metal film 460 remaining after the RTP anneal (wherein the phrase "at least substantially" is used to imply that there may be some residual metal 610 that remains on the semiconductor construction 100). The wet etch process leaves portions of the silicide 570 in the semiconductor construction 100. Residual metal 610, such as residual cobalt, may remain on the semiconductor construction 100 after the wet etch process. For example, the residual metal 610 may remain on one or more of the tiers of dielectrics 110, 120, 130, 140 and 150. The residual metal 610 may be a trace amount of metal. For the purposes of this document, a trace amount of a material is an amount of material that is detectable but not able to be quantified. The wet etch process may be implemented with, for example, a 5:1 mixture of concentrated $H_2SO_4$ in an approximately 30% $H_2O_2$ solution. Other possible mixtures include approximately a 3:1 mixture or approximately a 10:1 mixture of $H_2SO_4$. The wet etch process may occur at a temperature of between about 120 degrees and about 150 degrees Celsius. The wet etch process may also be implemented using only $H_2SO_4$ without the $H_2O_2$. Removal of the metal film 460 can improve control of the thickness of portions of the silicide 570.

The semiconductor construction 100 may be subject to a second RTP anneal to convert the portions of silicide 570 to di-silicide. If the metal film 460 comprises cobalt, the semiconductor construction 100 may be heated to a temperature of between about 750 and about 850 degrees Celsius for about 10 to about 60 seconds in a nitrogen ($N_2$) atmosphere during the second RTP anneal to cause the portions of silicide 570 to further react with the tiers of polysilicon 112, 122, 132 and 142. The portions of silicide 570 may comprise cobalt di-silicide ($CoSi_2$) after the second RTP anneal. The $CoSi_2$ is stable on silicon up to approximately 950 degrees Celsius. The formation of the $CoSi_2$ consumes approximately 3.64 nanometers of silicon per nanometer of Cobalt, and results in about 3.52 nanometers of di-silicide per nanometer of Cobalt. The $CoSi_2$ has a barrier height of approximately 0.65 electron volts with respect to the silicon.

The portions of silicide 570 may alternatively comprise, for example, titanium di-silicide ($TiSi_2$), tungsten di-silicide ($WSi_2$), nickel di-silicide ($NiSi_2$), tantalum di-silicide ($TaSi_2$), molybdenum di-silicide ($MoSi_2$), or platinum di-silicide ($PtSi_2$), depending on the composition of the metal film 460, according to various embodiments of the invention. The temperature of the second RTP anneal may be different for a different silicide composition. The second RTP anneal can provide improved control of the thickness of the resulting portions of di-silicide 570, and can remove more of the polysilicon from the tiers of polysilicon 112, 122, 132 and 142.

Figure 7:
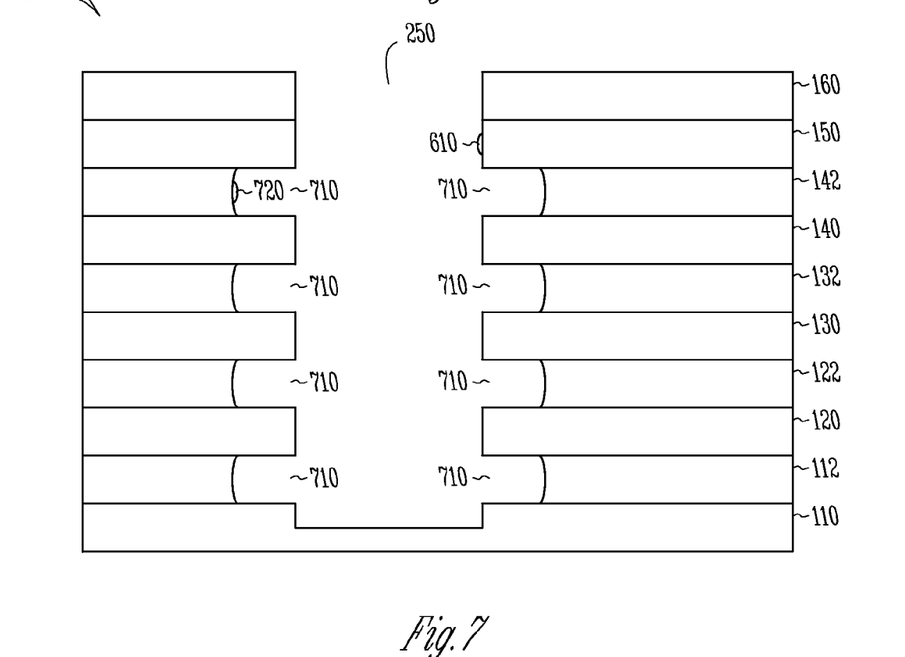
FIG. 7 is a cross-sectional side view of a semiconductor construction according to various embodiments of the invention.

FIG. 7 is a cross-sectional side view of the semiconductor construction 100 according to various embodiments of the invention. The semiconductor construction 100 can be subjected to a wet etch process, such as to remove substantially all of the portions of di-silicide 570. For example, the portions of di-silicide 570 may be etched with hot phosphoric acid ($H_3PO_4$) as an aqueous solution of approximately 85% phosphoric acid at a temperature of between about 180 degrees and about 220 degrees Celsius. The removal of substantially all of the portions of di-silicide 570 results in voids 710 in the tiers of polysilicon 112, 122, 132 and 142 between the tiers of dielectrics 110, 120, 130, 140 and 150 where the polysilicon 112, 122, 132 and 142 was consumed during formation of the portions of di-silicide 570. Residual di-silicide 720 may remain in the semiconductor construction 100 after the wet etch process. For example, residual di-silicide 720 may remain in one or more of the voids 710 between the tiers of dielectrics 110, 120, 130, 140 and 150 in the semiconductor construction 100 after the wet etch process. The residual silicide 720 may be a trace amount of the silicide. The wet etch process may alternatively be carried out with, for example, hot hydrofluoric acid according to various embodiments of the invention.

The semiconductor construction 100 can be subjected to a single RTP anneal to cause the metal film 460 inside the vertical channel 250 to react with the tiers of polysilicon 112, 122, 132 and 142 to form portions of di-silicide. If the metal film 460 comprises cobalt, the semiconductor construction 100 may be heated to a temperature of between about 750 and about 900 degrees Celsius for about 30 to about 120 seconds in a nitrogen ($N_2$) atmosphere to react the cobalt with the tiers of polysilicon 112, 122, 132 and 142 to produce $CoSi_2$ 570 according to various embodiments of the invention. The semiconductor construction 100 can be subjected to a wet etch process, such as to at least substantially remove the metal film 460 remaining after the RTP anneal. The wet etch process leaves portions of the $CoSi_2$ 570 in the semiconductor construction 100.

Any one or more of the acts shown and described with respect to FIGS. 2-7 can be repeated to enlarge the voids 710. The repetition of the acts described with respect to FIGS. 2-7 can also be used to exercise more control over the removal of polysilicon in the semiconductor construction 100.

Figure 8:
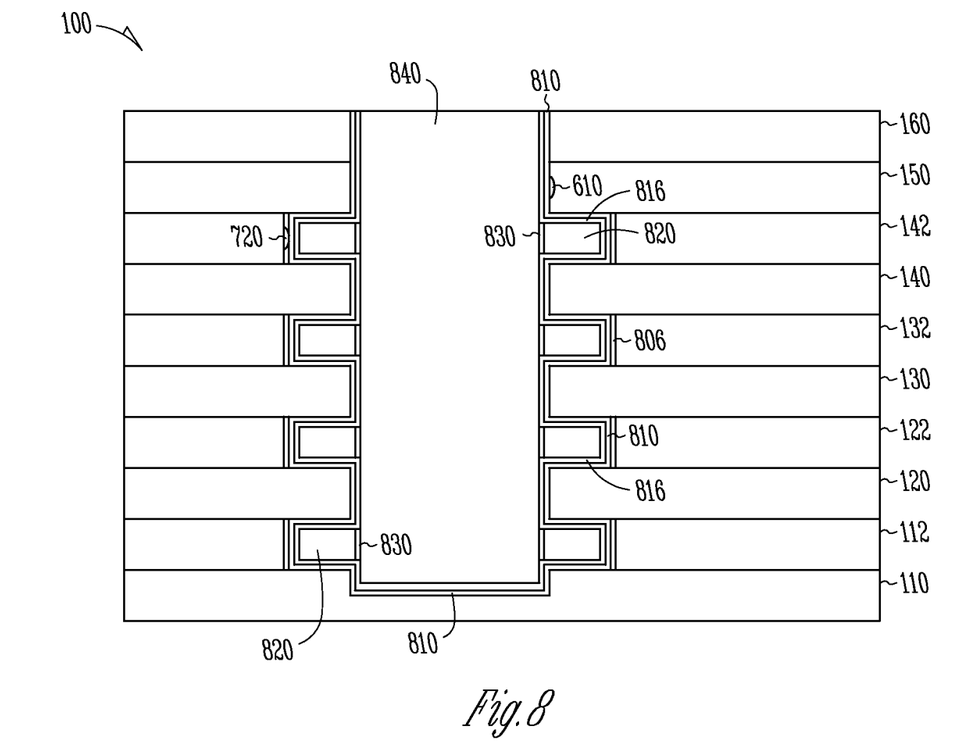
FIG. 8 is a cross-sectional side view of a semiconductor construction according to various embodiments of the invention.

FIG. 8 is a cross-sectional side view of the semiconductor construction 100 according to various embodiments of the invention. Silicon dioxide 806 is deposited on the tiers of polysilicon 112, 122, 132 and 142. Silicon nitride 810 is then deposited on the silicon dioxide 806, the tiers of dielectrics 110, 120, 130, 140 and 150 and the silicon nitride mask 160. Silicon dioxide 816 is deposited on the silicon nitride 810 to complete a blocking dielectric, such as oxide-nitride-oxide (e.g., $SiO_2Si_3N_4SiO_2$ or ONO) including the silicon dioxide 806, the silicon nitride 810 and the silicon dioxide 816.

Devices such as charge storage structures including, for example, floating gates 820, are formed at least partially in the voids 710 on the silicon dioxide 816. The floating gates 820 may be formed by depositing polysilicon to fill the vertical channel 250, and then etching the polysilicon with a blanket silicon etch to leave the polysilicon of the floating gates 820 at least partially filling the voids 710. A tunneling dielectric 830 is formed inside the vertical channel 250 over the floating gates 820. The tunneling dielectric 830 can be, for example, silicon dioxide or silicon nitride, and may be deposited or grown. A polysilicon pillar 840 is formed (e.g., by deposition) inside the vertical channel 250 on the tunneling dielectric 830. The polysilicon pillar 840 can be used as a conductive channel for the floating gates 820 in a not AND (NAND) string of memory cells. The blocking dielectric can also be, for example, nitride-oxide-nitride-oxide-nitride (e.g., $Si_3N_4SiO_2Si_3N_4SiO_2Si_3N_4$ or NONON) or other combinations of nitride and oxide films according to various embodiments of the invention.

Figure 9:
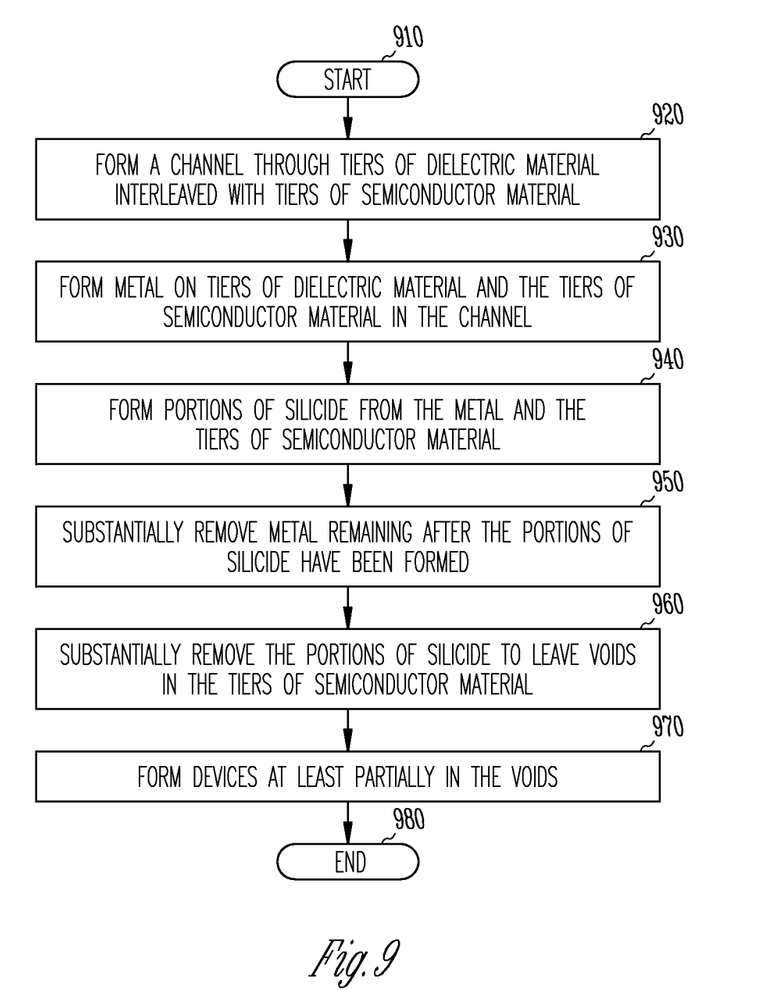
FIG. 9 is a flow diagram of one method according to various embodiments of the invention.

FIG. 9 is a flow diagram of one method 900 according to various embodiments of the invention. In block 910, the method 900 begins. In block 920, a channel is formed through tiers of dielectric material interleaved with tiers of semiconductor material. In block 930, metal is formed on the tiers of dielectric material and the tiers of semiconductor material in the channel. In block 940, portions of silicide are formed from the metal and the tiers of semiconductor material. In block 950, metal remaining after the portions of silicide have been formed is at least substantially removed. In block 960, the portions of silicide are at least substantially removed to leave voids in the tiers of semiconductor material. In block 970, devices, such as floating gates, are formed at least partially in the voids. In block 980, the method 900 ends. Various embodiments may have more or fewer activities than those shown in FIG. 9. The activities shown may be accomplished in the illustrated order, or in another order. Some activities may be substituted for others.

Multi-tiered semiconductor devices can be expensive to form because it can be difficult to form features in multiple tiers of semiconductor material. The inventors have discovered that such challenges, as well as others, can sometimes be addressed by depositing metal on tiers of dielectric material interleaved with tiers of semiconductor material, annealing the metal and the tiers of semiconductor material to form metal silicide, at least substantially removing remaining metal, and at least substantially removing the metal silicide to leave voids in the tiers of semiconductor material. This can result in the controlled formation of substantially uniform voids in the tiers of semiconductor material. Devices are formed at least partially in one or more of the voids.

Figure 10:
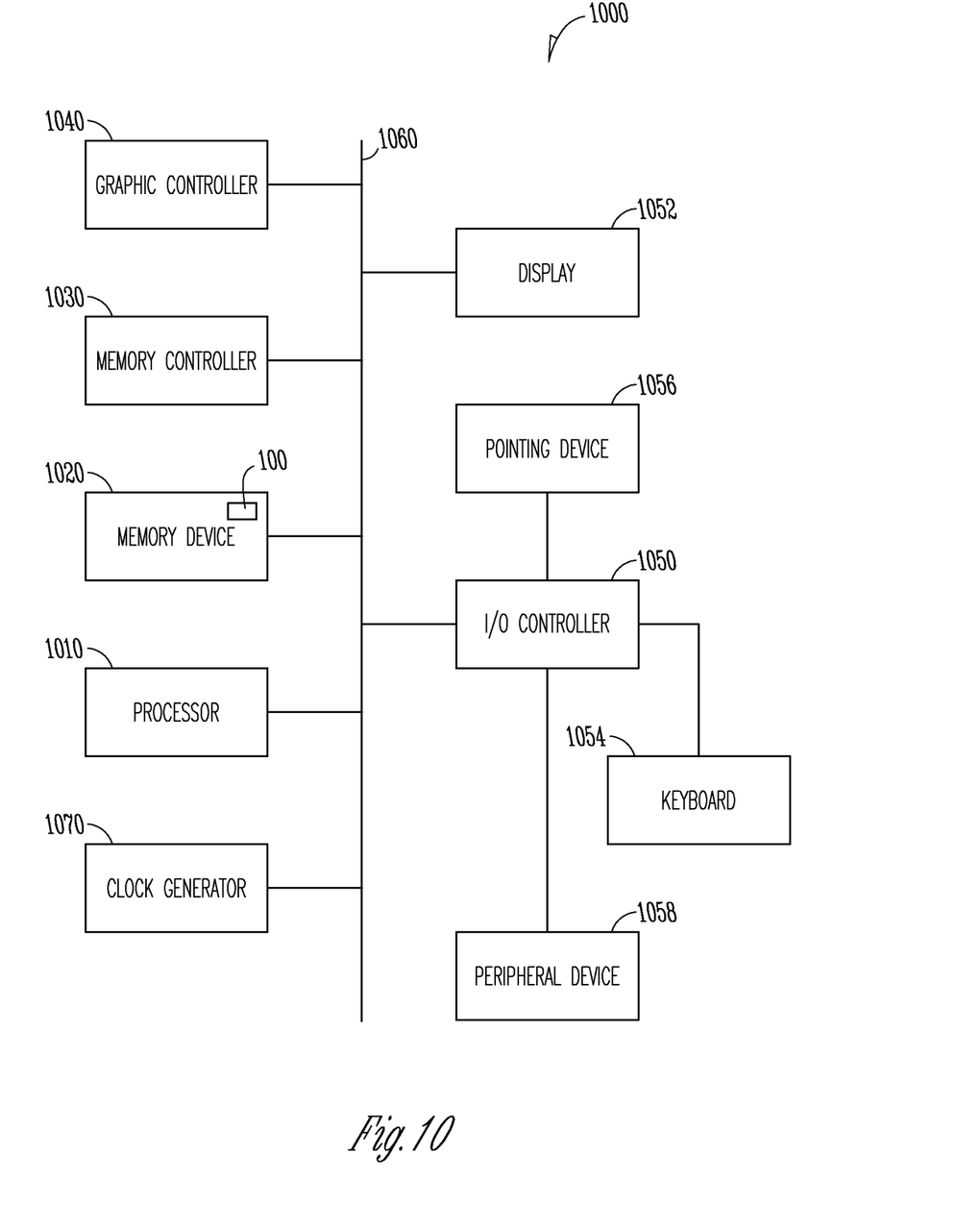
FIG. 10 is a diagram illustrating an apparatus in the form of a system according to various embodiments of the invention.

FIG. 10 is a diagram illustrating an apparatus in the form of a system 1000 according to various embodiments of the invention. The system 1000 may include a processor 1010, a memory device 1020, a memory controller 1030, a graphic controller 1040, an input and output (I/O) controller 1050, a display 1052, a keyboard 1054, a pointing device 1056, and a peripheral device 1058. A bus 1060 couples all of these devices together.

A clock generator 1070 can be coupled to the bus 1060 to provide a clock signal to at least one of the devices of the system 1000 through the bus 1060. The clock generator 1070 may include an oscillator in a circuit board such as a motherboard. Two or more devices shown in system 1000 may be formed in a single integrated circuit chip. The memory device 1020 comprises a semiconductor construction 100 such as those described herein and shown in the figures according to various embodiments of the invention. The semiconductor construction 100 may be included in a NAND memory device. The bus 1060 may be used to interconnect traces on a circuit board and may comprise one or more cables. The bus 1060 may couple the devices of the system 1000 by wireless mechanisms, such as by electromagnetic radiation, for example, radio waves. The peripheral device 1058 coupled to the I/O controller 1050 may be a printer, an optical device such as a CD-ROM and a DVD reader and writer, a magnetic device reader and writer such as a floppy disk driver, or an audio device such as a microphone.

The system 1000 represented by FIG. 10 may include computers (e.g., desktops, laptops, hand-helds, servers, network appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio 3) players, video games, watches, etc.), and the like.

Example apparatuses and methods of forming semiconductor constructions have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features can be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
   a tier of semiconductor material between tiers of dielectric material;
   a void in the tier of semiconductor material between the tiers of the dielectric; residual silicide lining the void on the tier of semiconductor material and/or on the tiers of dielectric material, wherein the residual silicide lining is a di-silicide lining resulting from two rapid thermal processing (RTP) anneal processes; and
   a device at least partially formed in the void and over the residual silicide;
   wherein the tier of semiconductor material comprises a tier of polysilicon;
   wherein the dielectric material comprises silicon dioxide;
   and wherein the device comprises a polysilicon floating gate.

2. The apparatus of claim 1, wherein the residual silicide is selected from the group consisting of platinum silicide, platinum di-silicide, molybdenum silicide, molybdenum di-silicide, cobalt silicide, cobalt di-silicide, titanium silicide, titanium di-silicide, tungsten silicide, tungsten di-silicide, nickel silicide, nickel di-silicide, tantalum silicide and tantalum di-silicide.

3. An apparatus comprising:
   a plurality of tiers of semiconductor material;

a plurality of tiers of dielectric material, each of the tiers of semiconductor material between respective ones of the tiers of dielectric material;

a respective void in each of the tiers of semiconductor material between the respective ones of the tiers of dielectric material;

residual silicide lining each of the voids on at least one of the tiers of semiconductor material and/or on at least one of the tiers of dielectric material, wherein the residual silicide lining is a di-silicide lining resulting from two rapid thermal processing (RTP) anneal processes; and a respective device at least partially formed in each of the voids and over the residual silicide;

wherein the tiers of semiconductor material comprise tiers of polysilicon;

wherein the dielectric material comprises silicon dioxide;

and wherein the device comprises a polysilicon floating gate.

4. The apparatus of claim 3, further comprising residual metal on at least one of the tiers of dielectric material.

5. The apparatus of claim 3, further comprising a blocking dielectric in each of the voids between the respective device and the respective tier of semiconductor material.

6. The apparatus of claim 5, wherein the blocking dielectric comprises oxide-nitride-oxide (ONO) or nitride-oxide-nitride-oxide-nitride (NONON).

7. The apparatus of claim 3, further comprising:
a blocking dielectric between each of the devices and the respective tier of semiconductor material; and
a tunneling dielectric between each of the devices and a pillar of semiconductor material.

8. The apparatus of claim 3 wherein each respective device is a memory device.

9. The apparatus of claim 8 wherein the memory device is a NAND memory device.

10. The apparatus of claim 3 further comprising a pillar of semiconductor material coupling each of the devices to act as a conductive channel in a NAND string of memory cells.

11. The apparatus of claim 10 wherein the conductive channel has a diameter in a range of 50 to 250 nanometers and a height of 2 micrometers.

12. The apparatus of claim 3 wherein the residual silicide is a trace amount of silicide.

13. The apparatus of claim 3 further comprising a silicon nitride mask formed over the plurality of tiers of semiconductor material and the plurality of tiers of dielectric material.

* * * * *